(12) United States Patent
Tanaka (10) Patent No.: US 7,723,167 B2
(45) Date of Patent: May 25, 2010

(54) PROCESS AND SYSTEM FOR LASER ANNEALING AND LASER-ANNEALED SEMICONDUCTOR FILM

(75) Inventor: Atsushi Tanaka, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 564 days.

(21) Appl. No.: 11/699,404

(22) Filed: Jan. 30, 2007

(65) Prior Publication Data

US 2007/0184641 A1    Aug. 9, 2007

(30) Foreign Application Priority Data

Feb. 6, 2006    (JP)    .............. 2006-028336

(51) Int. Cl.
*H01L 21/64*    (2006.01)
(52) U.S. Cl. ............... 438/164; 438/151; 438/166; 438/487; 257/E51.005; 257/64
(58) Field of Classification Search ......... 438/149–151, 438/97, 166, 662, 164, 487; 257/E51.005, 257/64
See application file for complete search history.

(56) References Cited

U.S. PATENT DOCUMENTS

2003/0129853 A1 * 7/2003 Nakajima et al. ........... 438/795

2005/0167663 A1 * 8/2005 Sasaki .................... 257/64

FOREIGN PATENT DOCUMENTS

| JP | 08-139331 A | 5/1996 |
|---|---|---|
| JP | 2004-228160 A | 8/2004 |

* cited by examiner

*Primary Examiner*—Khiem D Nguyen
*Assistant Examiner*—Wilner Jean Baptiste
(74) *Attorney, Agent, or Firm*—Sughrue Mion, PLLC

(57) ABSTRACT

In a laser annealing process: a bandlike area of a nonmonocrystalline semiconductor film is scanned and irradiated with continuous-wave laser light so as to produced fused regions in the first to third sections of the bandlike area as follows, where the third section contains a portion required to have higher crystallinity than other portions of the bandlike area. First, a first fused region having a substantially uniform width is formed in the first section. Then, at least a portion of the first fused region which is last fused is solidified, and thereafter at least a subportion of the solidified portion having a smaller width than the first fused region is re-fused. Subsequently, a second fused region having a stepwise or continuously increasing width is produced in the second section, and then a third fused region substantially uniformly having the increased width is produced in the third section.

17 Claims, 8 Drawing Sheets

FIG.3A STEP A OR D

FIG.3B SUBSTEP B-1

FIG.3C SUBSTEP B-2

FIG.3D STEP C

FIG.4A STEP A OR D

FIG.4B SUBSTEP B-1

FIG.4C SUBSTEP B-2

FIG.4D STEP C

FIG.5A STEP A OR D

FIG.5B STEP A OR D

FIG.6A SUBSTEP B-1

FIG.6B SUBSTEP B-1

FIG.7A  SUBSTEP B-2

FIG.7B  SUBSTEP B-2

FIG.8A  STEP C

FIG.8B  STEP C

PROCESS AND SYSTEM FOR LASER ANNEALING AND LASER-ANNEALED SEMICONDUCTOR FILM

BACKGROUND OF THE INVENTION

1. Field of the Invention

The present invention relates to a laser annealing process and a laser annealing system which irradiate a nonmonocrystalline semiconductor film with laser light so as to increase crystallinity of the nonmonocrystalline semiconductor film. In addition, the present invention also relates to a semiconductor film produced by use of the above laser annealing process or laser annealing system. Further, the present invention relates to a semiconductor device and an electro-optic device using the above semiconductor film.

2. Description of the Related Art

Currently, the active-matrix type driving systems are widely used in the electro-optic devices such as the electroluminescence (EL) devices and the liquid crystal (display) devices in which an image is displayed by dot-by-dot driving. In the active-matrix type driving systems, a great number of pixel electrodes arrayed in a matrix are driven through switching devices such as the thin-film transistors (TFTs) arranged in correspondence with the pixel electrodes.

In the active layers of the TFTs, amorphous or polycrystalline semiconductor films (normally silicon films) are widely used. In order to increase the characteristics of the TFT elements, it is desirable that the semiconductor films realizing the active layers exhibit high crystallinity, and it is particularly desirable that the semiconductor films realizing the active layers are monocrystalline.

In the manufacture of the TFTs, typically, an amorphous semiconductor film is formed, and laser annealing of the amorphous semiconductor film is performed for increasing the crystallinity of the film and transforming the semiconductor film into a polycrystalline semiconductor film. In the laser annealing, the semiconductor film is annealed by irradiating the semiconductor film with laser light. However, according to the conventional laser annealing techniques in which the entire surface of an amorphous semiconductor film is uniformly annealed, the increase in the crystallinity is limited, and it is difficult to transform the amorphous semiconductor film into a monocrystal.

In the electroluminescence (EL) devices, the liquid crystal devices, and the like, a great number of TFTs are formed in a predetermined pattern on a single substrate. Therefore, from the viewpoint of the manufacturing efficiency, it is desirable that the crystallinity of the areas in which the TFT elements are to be formed are selectively increased, and it is particularly desirable that the areas in which the TFT elements are to be formed are selectively transformed into monocrystals. However, when a grain boundary exists in an area in which a TFT element is formed, the characteristics of the TFT element deteriorate. Therefore, in order to achieve superior element characteristics and element uniformity, it is desirable that the positions of the areas the crystallinity of which is to be increased can be controlled.

In the technique disclosed in Japanese Unexamined Patent Publication No. 2004-228160, an insulation film having recessed regions is formed, and than an amorphous semiconductor film having a thickness greater than the depth of the recessed regions is formed on the insulation film. Thereafter, the amorphous semiconductor film is transformed into a polycrystalline semiconductor film by heat treatment, and laser annealing of the polycrystalline semiconductor film is performed. In particular, Japanese Unexamined Patent Publication No. 2004-228160 reports that portions of the polycrystalline semiconductor film formed in the recessed regions behave as nuclei of crystal growth, so that the recessed regions and their vicinities can be selectively and substantially completely transformed into monocrystals.

In addition, in the technique disclosed in Japanese Unexamined Patent Publication No. 8(1996)-139331, an amorphous semiconductor film is irradiated with first excimer laser having a first irradiation energy density so as to control the number of generated crystal nuclei, and thereafter the amorphous semiconductor film is further irradiated with second excimer laser having a second irradiation energy density greater than the first irradiation energy density so as to promote crystal growth from the crystal nuclei and transform the amorphous semiconductor film into a polycrystalline semiconductor film.

However, the technique disclosed in Japanese Unexamined Patent Publication No. 2004-228160 includes complicated process steps for forming the insulation film having recessed regions, and is therefore disadvantageous from the viewpoint of the manufacturing cost and the manufacturing efficiency. On the other hand, the technique disclosed in Japanese Unexamined Patent Publication No. 8 (1996)-139331 enables growth of large-size crystals. Nevertheless, this technique cannot control the positions in which the large crystals grow, since, according to this technique, the entire surface of the amorphous semiconductor film is uniformly processed.

SUMMARY OF THE INVENTION

The present invention has been developed in view of the above circumstances.

The first object of the present invention is to provide a laser annealing process and a laser annealing system which can selectively increase the crystallinity of a predetermined area of a nonmonocrystalline semiconductor film without complicated process steps, and can transform the predetermined area into substantially a monocrystal.

In addition, the second object of the present invention is to provide a semiconductor film which is produced by use of the above laser annealing process or laser annealing system, has high crystallinity, and is suitable for use as an active layer in a TFT or the like.

Further, the third object of the present invention is to provide a semiconductor device and an electro-optic device using the above semiconductor film.

In order to accomplish the above first object, the first aspect of the present invention is provided. According to the first aspect of the present invention, there is provided a laser annealing process for performing laser annealing of a nonmonocrystalline semiconductor film by scanning and irradiating the nonmonocrystalline semiconductor film with continuous-wave laser light so as to increase the crystallinity of a laser-annealed area of the nonmonocrystalline semiconductor film in such a manner that the crystallinity of a part of the laser-annealed area is higher than the crystallinity of other parts of the laser-annealed area. The laser annealing process comprises the steps of: (a) scanning and irradiating, with the continuous-wave laser light, a first section of a bandlike area of the nonmonocrystalline semiconductor film so as to produce a first fused region having a substantially uniform width in the first section of the bandlike area, where the bandlike area contains a predetermined portion which is required to have higher crystallinity than other portions of the bandlike area, and the first section is apart from the predetermined portion; (b) solidifying at least a portion of the first fused region which is last fused in the step (a); (c) re-fusing at least a subportion of the at least a portion of the first fused region solidified in the step (b) in such a manner that the at least a subportion of the at least a portion of the first fused region has a width smaller than the substantially uniform width of the first fused region; (d) uninterruptedly after the operation in the step (c), scanning and irradiating, with the continuous-wave laser light, a second section of the bandlike area so as to produce a second fused region in the second section of the bandlike area in such a manner that the second fused region has a width which stepwise or continuously increases from the width of the at least a subportion of the at least a portion of the first fused region at a boundary between the first section and the second section, where the second section is located between the first section and the predetermined portion, and abuts the first section; and (e) uninterruptedly after the operation in the step (d), scanning and irradiating, with the continuous-wave laser light, a third section of the bandlike area so as to produce a third fused region in the third section of the bandlike area in such a manner that the third fused region has a width which is substantially identical to the width of the second fused region at a boundary between the second section and the third section, where the third section abuts the second section, and contains the predetermined portion.

In addition, in order to accomplish the above first object, the second aspect of the present invention is provided. According to the second aspect of the present invention, there is provided a laser annealing system for performing laser annealing of a nonmonocrystalline semiconductor film by scanning and irradiating the nonmonocrystalline semiconductor film with continuous-wave laser light so as to increase the crystallinity of a laser-annealed area of the nonmonocrystalline semiconductor film in such a manner that the crystallinity of a part of the laser-annealed area is higher than the crystallinity of other parts of the laser-annealed area. The laser annealing system comprises: a laser-light irradiation unit which irradiates an area of the nonmonocrystalline semiconductor film with the continuous-wave laser light at each moment; a scanning unit which moves at least one of the continuous-wave laser light and the nonmonocrystalline semiconductor film so as to scan the nonmonocrystalline semiconductor film with the continuous-wave laser light; and a control unit which controls the laser-light irradiation unit and the scanning unit so that the laser annealing system performs the steps (a) to (e) in the laser annealing process according to the first aspect of the present invention.

According to the first and second aspects of the present invention, it is possible to make the crystallinity of the second and third sections of the bandlike area higher than the crystallinity of the first section of the bandlike area.

It is possible to perform the sequence of operations in the above steps (a) to (e) in each of one or more bandlike areas of the nonmonocrystalline semiconductor film, and it is possible to scan either the entire or part of the nonmonocrystalline semiconductor film.

The nonmonocrystalline semiconductor film in the first and second aspects of the present invention may be either an amorphous film or a polycrystalline film. When the sequence of operations for increasing the crystallinity is performed on a portion of an amorphous film, the portion of the amorphous film is transformed into a polycrystal or substantially a monocrystal. When the sequence of operations for increasing the crystallinity is performed on a portion of an polycrystalline film, the average grain size of the portion of the polycrystalline film is increased, or the portion of the polycrystalline film is transformed into substantially a monocrystal.

In this specification, the expression "a substantially uniform width" means that the variations in the width are within ±20% of a reference value of the width. In addition, each of the "stepwise" decrease and the "stepwise" increase may be realized by one or more step changes.

Preferably, the laser annealing process according to the first aspect of the present invention and the laser annealing system according to the second aspect of the present invention may also have one or any possible combination of the following additional features (i) to (vi).

(i) The width of the second fused region is continuously increased from the width of the at least a subportion of the at least a portion of the first fused region at the boundary between the first section and the second section.

(ii) The width of the second fused region is stepwise or continuously increased by stepwise or continuously increasing the output power of the continuous-wave laser light in the step (d).

(iii) The continuous-wave laser light is realized by a plurality of laser beams outputted from a plurality of laser-light sources, the width of the second fused region is stepwise or continuously increased by stepwise or continuously increasing the output power of at least one of the plurality of laser beams in the step (d).

(iv) The continuous-wave laser light is emitted from one or more semiconductor lasers.

(v) The step (b) is performed in such a manner that a condition $t<L/2V$ is satisfied at each moment in the scanning of the second section, L is a dimension, in a scanning direction, of an area of the nonmonocrystalline semiconductor film irradiated with the continuous-wave laser light at the moment, V is a relative velocity between the continuous-wave laser light and the nonmonocrystalline semiconductor film, and t is a time for which the step (b) is performed.

(vi) The step (b) is performed for a duration greater than 100 nanoseconds.

In addition, in order to accomplish the above second object, the third aspect of the present invention is provided. According to the third aspect of the present invention, there is provided a semiconductor film produced by using the laser annealing process according to the first aspect of the present invention.

Further, in order to accomplish the above third object, the fourth aspect of the present invention is provided. According to the fourth aspect of the present invention, there is provided a semiconductor device comprising as an active layer the semiconductor film according to the third aspect of the present invention in which an active region is formed in the aforementioned predetermined portion of the bandlike area.

Furthermore, in order to accomplish the above third object, the fifth aspect of the present invention is provided. According to the fifth aspect of the present invention, there is provided an electro-optic device comprising the semiconductor device according to the fourth aspect of the present invention. The electro-optic device according to the fifth aspect of the present invention includes, for example, an electroluminescence (EL) device, a liquid crystal device, an electrophoretic display device, a sheet computer containing one or more of the EL device, the liquid crystal device, the electrophoretic display device, and the like.

The advantages of the present invention are described below.

In the laser annealing process according to the first aspect of the present invention or the laser annealing system according to the second aspect of the present invention, the width of the fused region in the bandlike area is once narrowed and is then widened before the scanning reaches a predetermined area the crystallinity of which is to be increased (i.e., the aforementioned predetermined portion of the bandlike area), and laser annealing of the predetermined area the crystallinity of which is to be increased is performed so that the width of the fused region in the section of the bandlike area containing the predetermined area is substantially uniformly maintained at the widened width. The narrowing of the width of the fused region is realized by solidifying at least a portion of the region fused in the preceding step.

Therefore, according to the present invention, even in the case where a plurality of bands of crystal grains are grown in directions perpendicular to the scanning direction during the scanning with the continuous-wave laser light, the growing crystals are weeded out and generation of crystal nuclei is suppressed before the scanning reaches the predetermined area the crystallinity of which is to be increased. Therefore, it is possible to grow a large crystal grain from the suppressed number of crystal nuclei in the predetermined area the crystallinity of which is to be increased. In addition, according to the present invention, it is possible to selectively increase the crystallinity of the predetermined area the crystallinity of which is to be increased, and further make the predetermined area substantially monocrystalline. Furthermore, since it is possible to stably increase the crystallinity of the predetermined area the crystallinity of which is to be increased, the crystallinity of the predetermined area can be uniformly increased.

In addition, the solidification of the fused region and the change in the width of the fused region can be easily realized during the scanning with the continuous-wave laser light, for example, by changing the irradiation energy of the continuous-wave laser light. Therefore, according to the present invention, the crystallinity of the predetermined area the crystallinity of which is to be increased can be selectively increased by a simple operation during a scan of the nonmonocrystalline semiconductor film. That is, the manufacturing process is simple.

Further, in the laser annealing technique according to the present invention, a semiconductor (silicon) film which has high crystallinity and is suitable for use as active layers in TFTs can be manufactured at high throughput and low cost. Therefore, when the semiconductor film according to the present invention is used, it is possible to manufacture a semiconductor device (such as a TFT) superior in the element characteristics (e.g., carrier mobility) and the element uniformity at high throughput and low cost.

DESCRIPTION OF PREFERRED EMBODIMENTS

Preferred embodiments of the present invention are explained in detail below with reference to drawings. In the case which is taken as an example in the following explanations, an active-matrix substrate for use in an active-matrix type electro-optic device such as an electroluminescence (EL) device or a liquid crystal device is produced. In the active-matrix substrate, for example, a great number of thin-film transistors (TFTs) are arranged in a predetermined pattern in correspondence with a great number of pixel electrodes arrayed in a matrix. One or more TFTs are arranged for each pixel. In the case where circuit areas in which driver circuits and the like are formed are arranged around the pixel area in which the pixel electrodes are formed for image display or the like, TFTs may also be formed in the circuit areas.

Laser Annealing System

First, the laser annealing system according to an embodiment of the present invention is explained below.

The laser annealing system according to the present embodiment performs laser annealing of an area of a nonmonocrystalline semiconductor film for increasing the crystallinity of the annealed area of the nonmonocrystalline semiconductor film. Specifically, the laser annealing system irradiates an area of the nonmonocrystalline semiconductor film with laser light by scanning the area with the laser light so as to anneal the area. The laser light used in the present invention is continuous-wave laser light, and the pulsed laser light is not used in the present invention. Hereinafter, the laser light means continuous-wave laser light.

The nonmonocrystalline semiconductor film to be annealed may be either an amorphous semiconductor film or a polycrystalline semiconductor film. The composition of the nonmonocrystalline semiconductor film is not specifically limited, and may be, for example, silicon, germanium, a mixture of silicon and germanium, or the like. In the example explained below, the nonmonocrystalline semiconductor film is an amorphous silicon (a-Si) film, and the laser annealing system according to the present embodiment performs laser annealing of the a-Si film so as to increase the crystallinity of the a-Si film. The laser-annealed a-Si film is used as active layers of TFTs.

Figure 1:
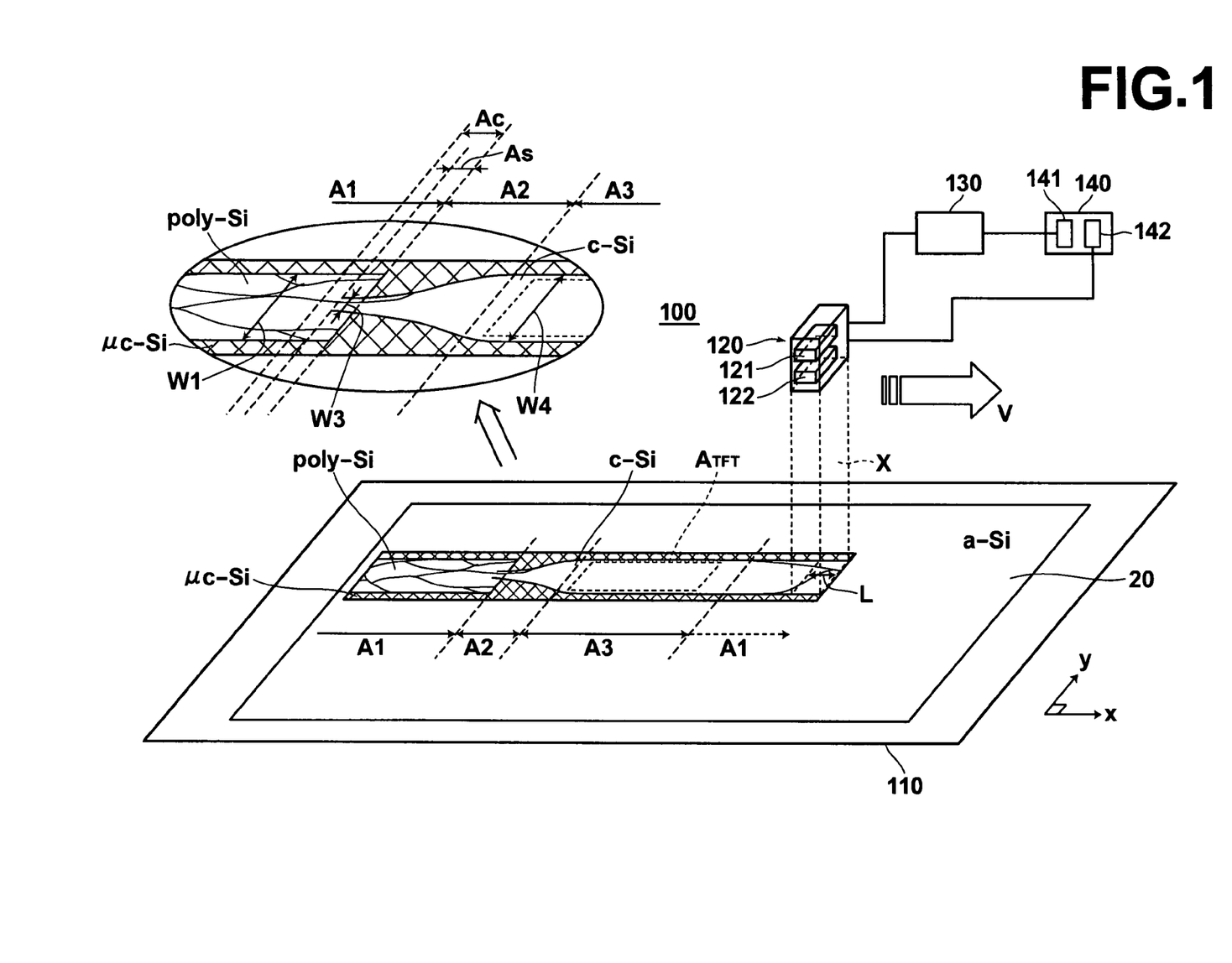
FIG. 1 is a schematic diagram for explaining a laser annealing system and a laser annealing process according to an embodiment of the present invention.

FIG. 1 is a schematic diagram for explaining the laser annealing system 100 and the laser annealing process according to the present embodiment. FIG. 1 includes a perspective view of an a-Si film 20 on which the laser annealing process is performed, a partial magnified view of an area of the a-Si film 20 subject to laser annealing, and a schematic diagram illustrating the construction of the laser annealing system 100. In FIG. 1, an element-formation area (of the a-Si film 20) on which a TFT is to be formed is indicated by the reference $A_{TFT}$.

The laser annealing system 100 comprises a stage 110, a single laser head 120, a laser-head movement device 130, and a controller 140. The a-Si film 20 is placed on the stage 110. The laser head 120 realizes the aforementioned laser-light irradiation unit, and laser light X with which an area of the a-Si film 20 is irradiated is emitted from the laser head 120. The laser light X forms an approximately rectangular spot on the a-Si film 20. The laser-head movement device 130 realizes the aforementioned scanning unit, and mechanically moves the laser head 120 relative to the a-Si film 20 in the x and y directions so that the a-Si film 20 is scanned with the laser light X, where the x and y directions are perpendicular to each other and parallel to the surface of the a-Si film 20. The controller 140 realizes the aforementioned controlling unit, and controls the entire laser annealing system.

In the present embodiment, the x direction is the main scanning direction, and the y direction is the subscanning direction. That is, every time a scanning operation along a line in the x direction is completed, the position of the laser head 120 relative to the a-Si film 20 is shifted in the y direction, and the next scanning operation in the x direction is performed along a line at the shifted position.

The laser head 120 contains a laser oscillator 121 and a laser-guiding optical system 122. The laser oscillator 121 emits the laser light X, and the laser-guiding optical system 122 guides the laser light X. Preferably, the laser oscillator 121 is a semiconductor laser or the like, and the laser-guiding optical system 122 is constituted by one or more types of optical components such as one or more lenses, one or more mirrors, and a homogenizer (which realizes a uniform energy distribution of the laser light X). The laser-guiding optical system 122 is provided only when necessary. One or more portions of the laser oscillator 121 and the laser-guiding optical system 122 may be arranged outside the laser head 120. Further, the laser oscillator 121 may be constituted by a plurality of laser oscillators. In this case, the a-Si film 20 may be irradiated with a plurality of laser beams which are independently emitted from the respective laser oscillators, or with a laser beam generated by optically combining the plurality of laser beams emitted from the laser oscillators.

Although the laser-head movement device 130 mechanically moves the laser head 120 for scanning, alternatively, it is possible to realize the scanning of the laser light X by using an optical means such as a galvano mirror. Further alternatively, the stage 110 may be realized by a movable stage. In this case, the relative movement between the a-Si film 20 and the laser light X can be realized by movement of the stage 110 instead of the movement of the laser head 120 or a combination of the movement of the laser head 120 and the movement of the stage 110.

Laser Annealing Process

Next, the laser annealing process according to the present embodiment is explained below.

From the viewpoint of the element characteristics (such as the carrier mobility), it is desirable that the crystallinity of the laser-annealed silicon film is high, and it is particularly desirable that the silicon film after the laser annealing is substantially monocrystalline. In addition, in the EL devices and liquid crystal devices, it is necessary to form a great number of TFTs in a predetermined pattern on a substrate. Therefore, from the viewpoint of the manufacturing efficiency and the uniformity in the element characteristics, it is desirable to selectively increase the crystallinity of the element-formation area $A_{TFT}$, and particularly desirable to selectively transform the element-formation area $A_{TFT}$ into a monocrystal.

According to the present embodiment, the area to be annealed is not uniformly processed. Instead, a portion of a fused region is solidified and the width of the fused region is varied so as to make the crystallinity of a predetermined section A3 (illustrated in FIG. 1) of an irradiated area containing the element-formation area $A_{TFT}$ higher than the other portions of the irradiated area.

FIGS. 2A to 2D are diagrams illustrating representative steps in the laser annealing process according to the embodiment of the present invention. Specifically, FIGS. 2A to 2D show representative steps in a sequence of operations performed during scanning of a bandlike area containing the element-formation area $A_{TFT}$ for laser annealing the bandlike area so as to selectively make the crystallinity of the element-formation region $A_{TFT}$ higher than the other portions of the bandlike area. In addition, FIGS. 3A to 3D are graphs indicating examples of the distributions of the irradiation energy density of the laser light X and the film temperature over the fused region in the respective steps in the case where the distributions of the irradiation energy density of the laser light X are relatively narrow. In each of FIGS. 3A to 3D, the abscissa indicates the position in the y direction (i.e., the direction of the width of the fused region, which may be hereinafter referred to as the width direction).

The sequence of operations performed during the scanning of the bandlike area containing the element-formation area $A_{TFT}$ by using the laser annealing system illustrated in FIG. 1 for laser annealing the bandlike area is explained below with reference to FIGS. 2A to 2D and 3A to 3D.

Figure 2A:
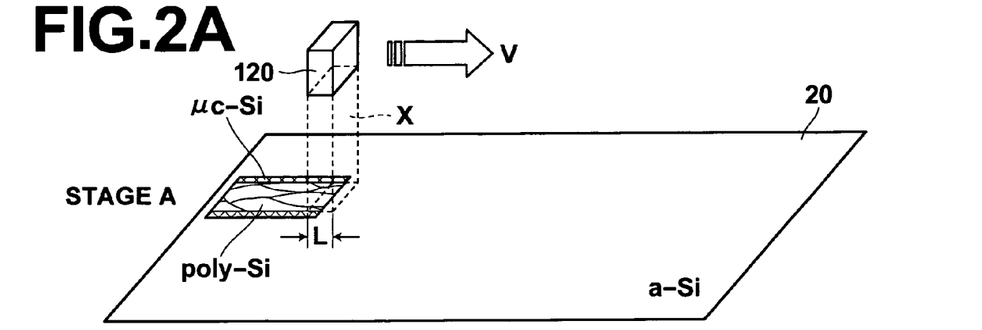
FIGS. 2A, 2B, 2C, and 2D are diagrams illustrating representative steps in the laser annealing process according to the embodiment of the present invention.

In the step A illustrated in FIG. 2A, laser annealing of the first section A1 of the bandlike area of the a-Si film 20, which is apart from the aforementioned predetermined section A3 of the bandlike area, is performed in such a manner that the width of the fused region is substantially uniformly maintained during the scanning of the first section A1 with the laser light X. Since the width of the fused region is determined by the distribution of the irradiation energy density of the laser light X, the irradiation energy density of the laser light X outputted from the laser head 120 is substantially uniformly maintained during the laser annealing of the first section A1 of the bandlike area.

Figure 3A:
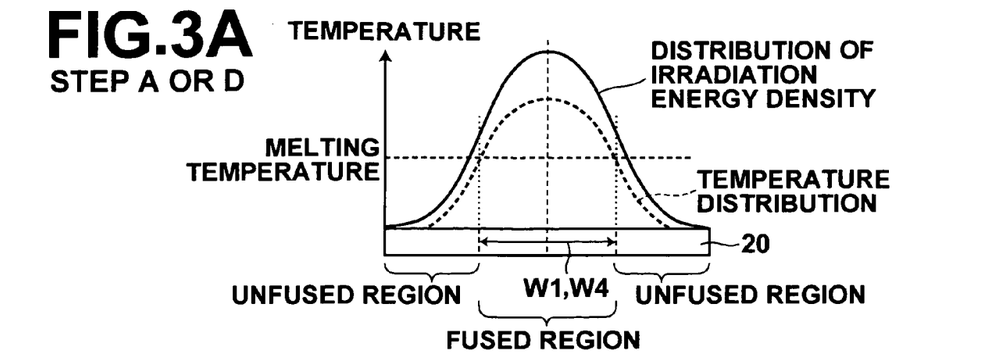
FIGS. 3A to 3D are graphs indicating examples of the distributions of the irradiation energy density of laser light X and the film temperature over the fused region in the respective steps in the case where the distributions of the irradiation energy density of the laser light X are relatively narrow.

The distributions of the irradiation energy density of the laser light X and the film temperature over the fused region during the laser annealing of the first section A1 of the bandlike area of the a-Si film 20 are indicated in FIG. 3A. As indicated in FIG. 3A, the film temperature is maximized at the center of the fused region in the width direction, and decreases with the distance from the center, so that only the region within the width W1, in which the film temperature is higher than the melting temperature, fuses. That is, the width of the fused region during the laser annealing of the first section A1 of the bandlike area of the a-Si film 20 is W1. In addition, the total irradiation energy (of the distribution indicated in 3A) per unit time during the laser annealing of the first section A1 is assumed to be E1.

As illustrated in FIGS. 1 and 2A, in the step A, the crystallinity of the fused region is increased by the laser annealing, and the amorphous silicon (a-Si) in the fused region is transformed into polycrystalline silicon (poly-Si). In addition, sometimes microcrystalline silicon (μc-Si), the crystal grain size of which is very small, is produced outside the region in which the poly-Si is produced. The region in which the μc-Si is produced differs depending on the annealing condition and the like. For example, the μc-Si can be produced in the unfused region which is irradiated and is not fused, and in the unirradiated area which is located immediately outside the unfused region.

Figure 2B:
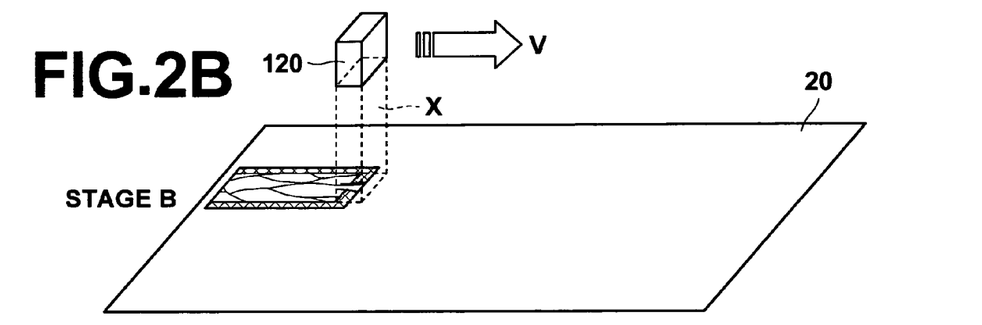

Next, the operations in the step B are performed. The step B includes the substeps B-1 and B-2. In the substep B-1, at least a portion of the last fused region of the first section A1 of the bandlike area (i.e., at least a portion of the first section A1 which is last fused in the step A) is solidified. Thereafter, in the substep B-2, at least a subportion of the solidified portion of the last fused region is re-fused in such a manner that the width of the re-fused subportion is smaller than the width of the region fused in the step A.

In the substep B-1, the solidified portion is transformed into poly-Si. In the substep B-2, at least a subportion of the solidified portion is re-fused, so that at least a subportion of the solidified portion comes into a molten state. The operation in the substep B-1 can be realized by lowering the total irradiation energy per unit time (outputted from the laser head 120) from E1 to E2. Preferably, the value E2 of the total irradiation energy per unit time is zero or a small value near to zero. The width W2 of a region fused in the substep B-1 is zero or a small value near to zero. In the substep B-1, the output power from the laser head 120 may be decreased stepwise or continuously. However, since it is necessary to overlap the portion crystallized in the step A and the subportion re-fused in the substep B-2, it is preferable to lower by a single step change the output power from the laser head 120 in the substep B-1.

The operation in the substep B-2 can be realized by slightly increasing the total irradiation energy per unit time (outputted from the laser head 120) from E2 to E3, where E3<E1. Thus, the width W3 of the fused region in the substep B-2 satisfies the relationships W2<W3<W1.

In the substeps B-1 and B-2, it is possible to continue the continuous scanning of the laser light outputted from the laser head 120 without stopping the scanning.

Since the laser head 120 has a certain width in the main scanning direction, the portion of the first section A1 which is last processed with the laser light outputted from the laser head 120 in the substep A and the subportion which is processed with the laser light outputted from the laser head 120 in the substep B-2 partially overlap, so that it is possible to solidify at least in part the region which is last fused in the step A.

In FIG. 1, the extent (in the main scanning direction) of the solidified portion of the last fused region (i.e., the portion of the first section A1 which is last fused in the step A and solidified in the substep B-1) is indicated by the reference Ac, and the extent (in the main scanning direction) of the re-fused subportion of the solidified portion of the last fused region (i.e., the portion of the first section A1 which is last fused in the step A, solidified in the substep B-1, and re-fused in the substep B-2) is indicated by the reference As.

From the viewpoint of the time efficiency, it is preferable that the scanning with laser head 120 be continuously performed in the substeps B-1 and B-2 without stopping the scanning. However, since substantially no annealing (irradiation) is performed in the substep B-1, the scanning with laser head 120 may be temporarily stopped in the substep B-1.

Figure 3B:
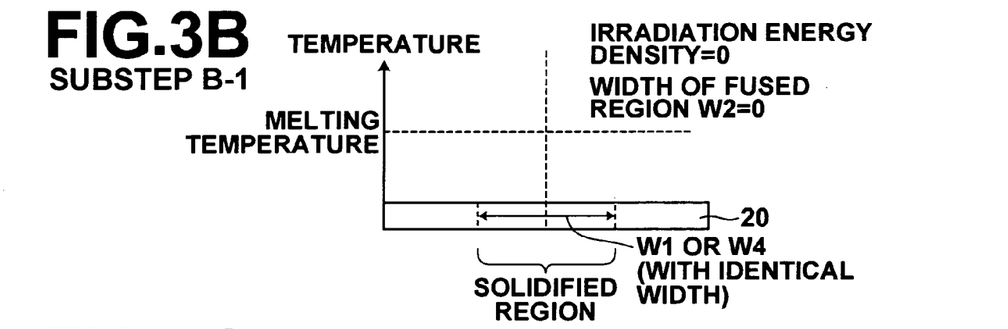
Figure 3C:
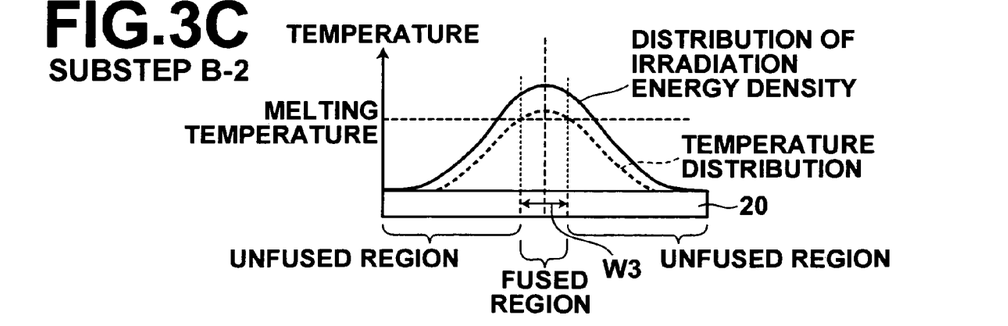

Examples of the distributions of the irradiation energy density of the laser light X and the film temperature over the fused region in the substeps B-1 and B-2 are respectively indicated in FIGS. 3B and 3C. In the example of FIG. 3B, the output from the laser head 120 is turned off (i.e., the irradiation energy E2 is zero and the width of the fused region W2 is zero) in the substep B-1, and the entire width of the portion of the first section A1 which is last fused in the scanning in the step A is fully solidified in the extent Ac indicated in FIG. 1 in the substep B-1. Thereafter, in the substep B-2, a subportion of the solidified portion is re-fused with the irradiation energy density E3, which is less than the irradiation energy density E1 in the step A.

Since the width of the fused region in the substep B-2 is smaller than the width of the fused region in the step A, it is possible to weed out growing crystals and suppress the number of crystal nuclei at the end of the step B.

Figure 2C:
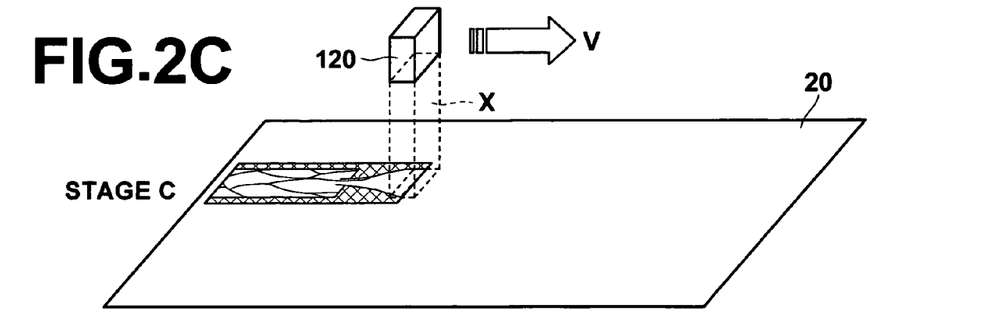
Figure 3D:
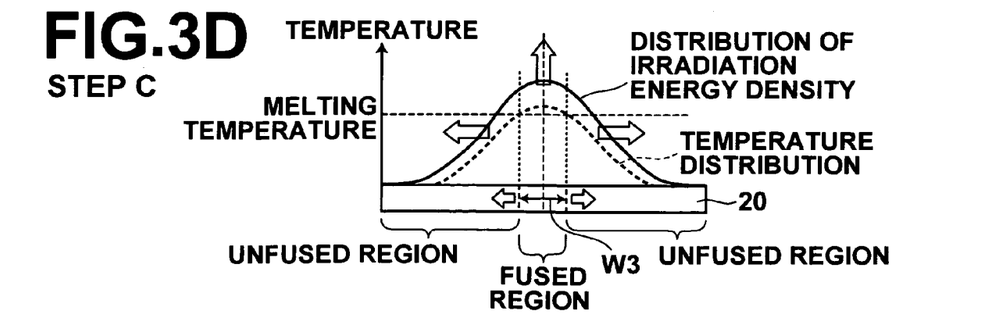
Figure 4A:
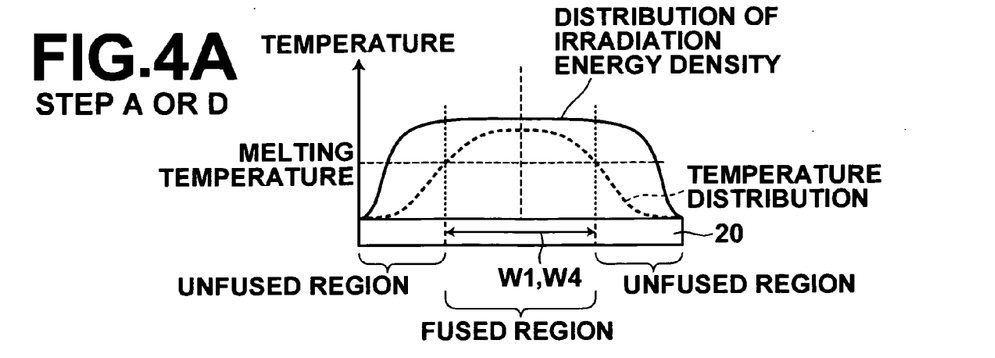
FIGS. 4A to 4D are graphs indicating examples of the distributions of the irradiation energy density of the laser light X and the film temperature over the fused region in the respective steps in the case where the distributions of the irradiation energy density of the laser light are relatively broad.
Figure 4B:
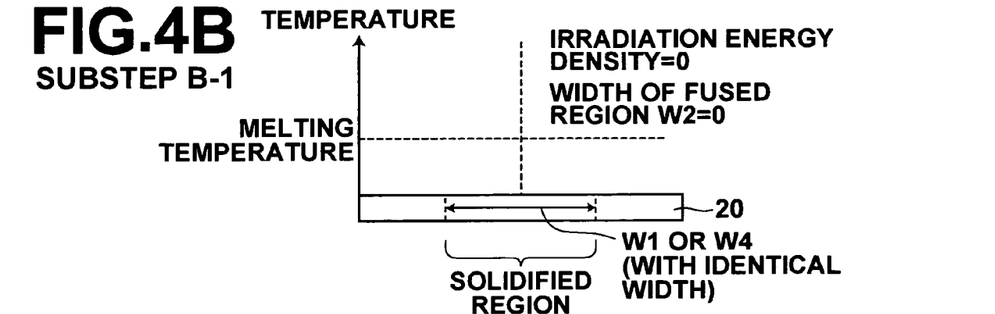
Figure 4C:
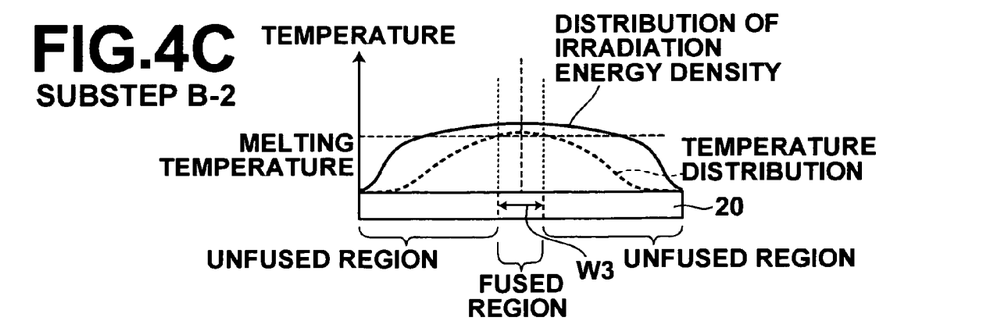
Figure 4D:
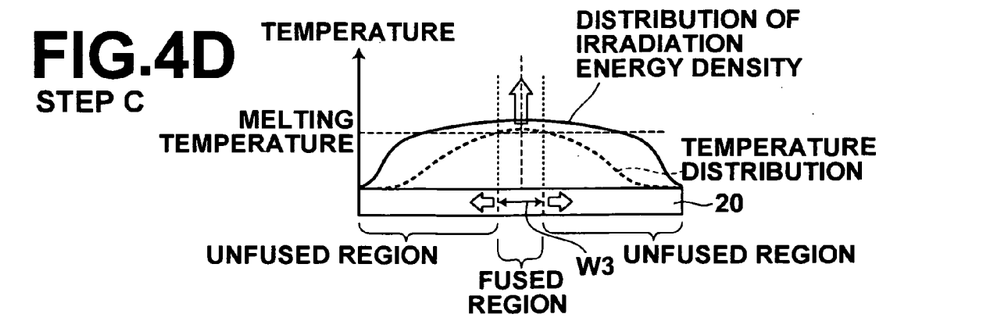

Next, in the step C illustrated in FIG. 2C, laser annealing of the second section A2 of the bandlike area of the a-Si film 20 (which is located between the first and third sections A1 and A3) is performed in such a manner that the width of the fused region is continuously increased from the width W3 of the fused region at the end of the step B. The continuous increase in the width of the fused region is realized by continuously increasing the irradiation energy density of the laser light X outputted from the laser head 120 as indicated in FIG. 3D. In the step C, the total irradiation energy per unit time is continuously increased from E3 to E4, so that the width of the fused region is continuously increased from W3 to W4.

Figure 2D:
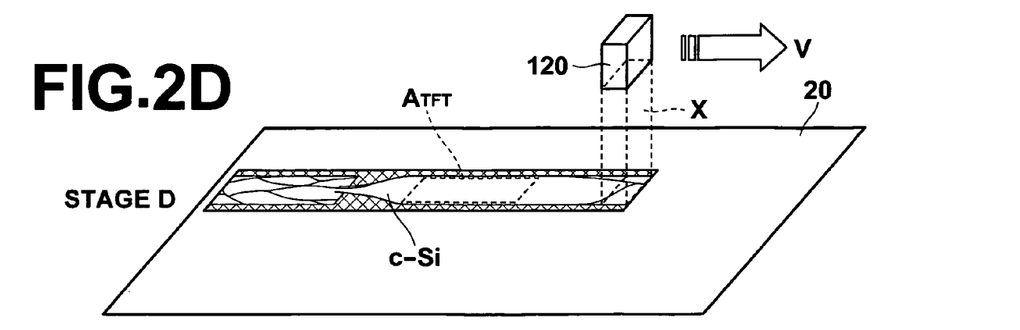

Next, in the step D illustrated in FIG. 2D, laser annealing of the third section A3 of the bandlike area of the a-Si film 20 is performed in such a manner that the width of the fused region in the third section A3 is substantially uniformly maintained at the increased width W4. Actually, the irradiation energy density of the laser light X outputted from the laser head 120 is substantially uniformly maintained during the laser annealing of the third section A3 of the bandlike area of the a-Si film 20. When the third section A3 of the bandlike area of the a-Si film 20 is irradiated with the laser light X, the distributions of the irradiation energy density of the laser light X and the film temperature over the fused region are as indicated in FIG. 3A. The first and third sections A1 and A3 may be laser annealed either under identical annealing conditions (i.e., E1=E4 and W1=W4) or under different annealing conditions. However, it is preferable that the first and third sections A1 and A3 be laser annealed under identical conditions, as assumed in FIGS. 3A and 3B.

As illustrated in FIG. 1, the controller 140 comprises a scanning controller 141 and an output controller 142. The scanning controller 141 controls the laser-head movement device 130, and the output controller 142 controls the output power from the laser head 120. The movement of and the output power from the laser head 120 are controlled by the scanning controller 141 and the output controller 142 so that the above operations in the steps A to D are performed.

Since growing crystals are weeded out and production of crystal nuclei is suppressed in the step B, it is possible to grow a large-size crystal from the suppressed number of crystal nuclei in the step C (in which the width of the fused region is continuously increased) and the step D (in which the width of the fused region is maintained at the width increased in the step C). Therefore, according to the present embodiment, it is possible to make the crystallinity of the second and third sections A2 and A3 of the annealed bandlike area higher than the crystallinity of the first section A1 of the annealed bandlike area.

In addition, according to the present embodiment, it is possible to selectively increase the crystallinity of the third section A3 (the crystallinity of which is required to be increased), and make the third section A3 substantially monocrystalline. FIGS. 1 and 2D show an example in which monocrystalline silicon (c-Si) extends over the second and third sections A2 and A3 of the annealed bandlike area.

When the width W3 of the fused region at the end of the step B is smaller, the number of generated crystal nuclei can be more effectively suppressed, so that it is possible to attain higher crystallinity of the third section A3. When the number of generated crystal nuclei can be reduced to one at the end of the step B, it is possible to stably make the third section A3 substantially monocrystalline. Even in the step D, sometimes μc-Si can be produced in the unfused region (which is irradiated and is not fused) as in the step A. Therefore, the expression "make the third section A3 substantially monocrystalline" means to make the portion of the third section A3 other than the above unfused region monocrystalline.

When the operations in the steps A to D are performed so that the above monocrystalline portion produced in the third section A3 of the annealed bandlike area covers the element-formation area $A_{TFT}$, it is possible to stably achieve high crystallinity of the element-formation area $A_{TFT}$, and stably make the element-formation area $A_{TFT}$ monocrystalline.

When the scanning with the laser light X in the step D is continued for a certain time, the effect of increasing the crystallinity caused by weeding out the growing crystals in the step B wears off, so that the operation in the step D naturally transitions to the operation in the step A. Therefore, it is possible to selectively increase the crystallinity of the next element-formation area $A_{TFT}$ and selectively make the next element-formation area $A_{TFT}$ monocrystalline by performing the operations in the steps B and C and starting the operation in the step D before the scanning reaches the next element-formation area $A_{TFT}$. Thus, it is possible to selectively increase the crystallinity of a great number of element-formation areas $A_{TFT}$ and selectively make the great number of element-formation areas $A_{TFT}$ monocrystalline by repeatedly performing the operations in the steps A to D.

It is preferable that the operations in the step B be performed in such a manner that the condition t<L/2V is satisfied at each moment in the step B, where L is the dimension, in the main scanning direction, of the area of the a-Si film 20 irradiated with the laser light X at the moment as indicated in FIGS. 1 and 2A, V is the relative velocity between the laser light X and the a-Si film 20 as indicated in FIGS. 1, 2A, 2B, 2C, and 2D, and t is the time for which the operation in the substep B-1 for solidifying at least a portion of the last fused region (i.e., the region of the first section A1 of the bandlike area which is last fused in the step A) is performed. That is, it is preferable that the controller 140 control the operations in the step B so as to satisfy the above condition. Further, it is also preferable that t>100 nanoseconds (nsec), i.e., the controller 140 control the operations in the step B so as to satisfy the condition that t>100 nsec.

When the above condition t<L/2V is satisfied, the operations in the step B including the operation for solidifying at least a portion of the last fused region of the first section A1 (i.e., the region of the first section A1 of the bandlike area which is last fused in the step A) are stably performed, so that the number of generated crystal nuclei at the end of the step B can be stably reduced to a sufficiently small number (preferably one), and the effect of increasing the crystallinity in the step D can be stably achieved.

If the time equal to or greater than L/2V elapses in the substep B-1, it is difficult to stably make the region crystallized in the step A overlap the region re-fused in the substep B-2, so that the number of crystal nuclei may not be able to be desirably controlled in the step B.

It is conventionally considered that solidification of each fused portion is completed in 100 nsec after irradiation is stopped in the case where laser annealing is performed by use of pulsed-wave laser light (having a pulse width of tens of nanoseconds). However, according to the present invention, the continuous-wave laser light is used. Therefore, it is considered that it takes more time to solidify each fused portion in the case where laser annealing is performed by use of the continuous-wave laser light than in the case where laser annealing is performed by use of pulsed-wave laser light. Thus, it is preferable that the time t for which the operation in the substep B-1 is performed be longer than 100 nsec.

The distributions of the irradiation energy density differ according to the structure of the laser head 120. In the example of FIGS. 3A to 3D, the distributions of the irradiation energy density have relatively sharp peak. Alternatively, it is possible to use laser light realizing broad distributions of the irradiation energy density. FIGS. 4A to 4D show examples of the distributions of the irradiation energy density of the laser light X and the film temperature over the fused region in respective steps in the case where the distributions of the irradiation energy density of the laser light are relatively broad. Even when the laser light having broad distributions of the irradiation energy density is used, it is also possible to selectively increase the crystallinity of the element-formation areas $A_{TFT}$ and make the element-formation areas $A_{TFT}$ substantially monocrystalline by performing the operations in the steps A to D.

Although the width of the fused region is continuously increased in the step C as explained before, alternatively, the width of the fused region may be stepwise increased in the step C. In this case, the width of the fused region may be increased by one or more step changes. It is possible to stepwise change the width of the fused region by stepwise changing the output power from the laser head 120.

However, when the width of the fused region is continuously changed, it is possible to more easily control the operations for increasing the crystallinity in the step D, and more stably achieve the effect of increasing the crystallinity in the step D. Therefore, it is preferable that the width of the fused region be continuously changed in the step C.

The widths W1, W2, W3, and W4 of the fused regions in the first and second sections A1 and A2 and the lengths (in the main scanning direction) of the first and second sections A1 and A2 are set so as to achieve the effect of increasing the crystallinity in the step D, and no other limitation is imposed on the widths of the fused regions in and the lengths (in the main scanning direction) of the first and second sections A1 and A2. In an exemplary case where each element-formation area $A_{TFT}$ has the dimensions of approximately 10×10 micrometers, for example, the extent Ac (in the main scanning direction) of the solidified portion of the last fused region (i.e., the portion of the first section A1 which is fused in the step A and solidified in the substep B-1) is one to several micrometers, the extent As (in the main scanning direction) of the re-fused subportion of the solidified portion (i.e., the subportion of the first section A1 which is fused in the step A, solidified in the substep B-1, and re-fused in the substep B-2) corresponds to the size of a crystal nucleus (approximately one micrometer or less), the width W3 of the re-fused subportion at the end of the step B corresponds to the size of a crystal nucleus (approximately one micrometer or less), and the length (in the main scanning direction) of the second section A2 of the bandlike area is several micrometers.

The advantages of the present embodiment are summarized below.

(1) As explained above, according to the present embodiment, the width of the fused region is once narrowed by performing the above operations including the step of solidifying at least a portion of the fused region, and is then widened, before the scanning reaches a predetermined area (i.e., the aforementioned predetermined portion of the bandlike area) the crystallinity of which is to be increased. Thereafter, the predetermined area (contained in the third section A3 of the bandlike area) is laser annealed so that the fused region in the third section A3 has the widened width. Therefore, according to the present embodiment, growing crystals are weeded out and generation of crystal nuclei is suppressed before the scanning reaches the predetermined area the crystallinity of which is to be increased, so that it is possible to grow a large-size crystal from the suppressed number of crystal nuclei in the predetermined area.

(2) According to the present embodiment, it is possible to selectively increase the crystallinity of the above predetermined area, and make the predetermined area substantially monocrystalline. Further, according to the present embodiment, the crystallinity of the above predetermined area can be stably increased. Therefore, the crystallinity of the above predetermined area can be substantially uniformly increased.

(3) According to the present embodiment, the crystal growth is once stopped by the solidification, and thereafter only the subportion in which crystal growth is required is re-fused. Therefore, it is possible to consider that the first section A1 (in which crystal growth occurs before the solidification) and the second section A2 (in which crystal growth occurs after the re-fusing) can be satisfactorily separated, and the effect of relaxing strain which occurs between the first and second sections A1 and A2 can be achieved.

(4) According to the present embodiment, at least a portion of the fused region is solidified and the width of the fused region is changed by changing the output power from the laser head 120 so as to change the irradiation energy density of the laser light X during the scanning with the laser light X. Therefore, it is possible to selectively increase the crystallinity of the predetermined area (the crystallinity of which is to be increased) by only performing a single laser annealing (scanning) operation of the a-Si film 20, which is a simple operation. That is, the manufacturing process is simple.

(5) In the laser annealing technique according to the present embodiment, a semiconductor (silicon) film which has high crystallinity and is suitable for use as active layers in TFTs can be manufactured at high throughput and low cost.

Variations of the Embodiment

In the embodiment explained above, the operation in the step C is performed by changing the output power from the laser head 120. Alternatively, the width of the fused region in the operation in the step C can be changed by changing the area of the a-Si film 20 irradiated with the laser light X at each moment without changing the output power, and the area of the a-Si film 20 irradiated with the laser light X at each moment can be changed by arranging and using a variable slit, an aperture, or the like in the laser head 120. Further alternatively, it is possible to change the width of the fused region in the operation in the step C by a combination of the change in the output power from the laser head 120 and the change in the area of the a-Si film 20 irradiated with the laser light X at each moment.

In the embodiment explained above, the laser annealing system 100 comprises a single laser head 120 as the laser-light irradiation unit. Alternatively, the laser-light irradiation unit in the laser annealing system 100 may be realized by a plurality of laser heads. When the laser annealing system 100 comprises a plurality of laser heads, it is possible to control the laser annealing system 100 so that each of the plurality of laser heads operates in a similar manner to the case where the laser annealing system 100 comprises the single laser head 120. In this case, it is possible to obtain advantages similar to the embodiment explained before. Alternatively, it is also possible to change the width of the fused region in the operation in the step C by changing the output power of only a portion of the plurality of laser heads as illustrated in FIGS. 5A, 6A, 7A, and 8A.

Figure 5A:
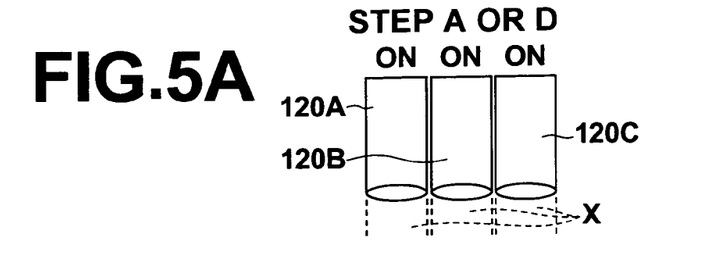
FIG. 5A is a diagram illustrating an arrangement of a plurality of laser heads and the operational states of the plurality of laser heads in the step A or D in a variation of the embodiment of the present invention.
Figure 5B:
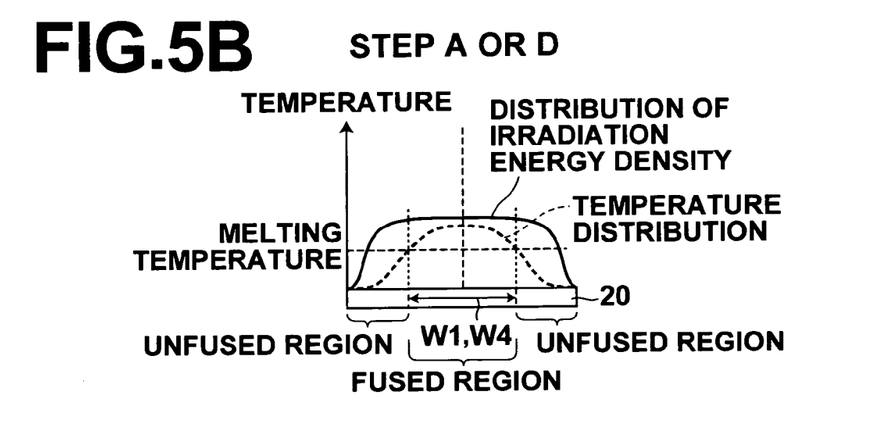
FIG. 5B is a graph indicating examples of the distributions of the irradiation energy density of the laser light and the film temperature over a fused region in the step A or D in the variation of the embodiment of the present invention.
Figure 6A:
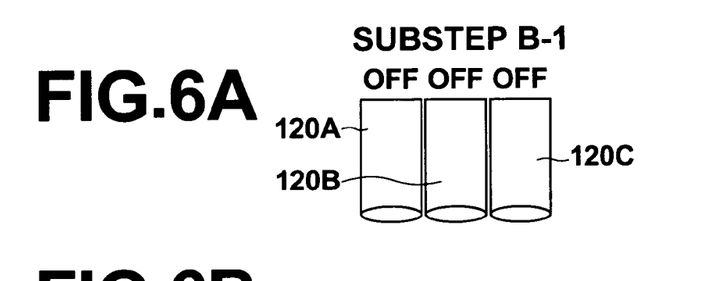
FIG. 6A is a diagram illustrating the arrangement of the plurality of laser heads and the operational states of the plurality of laser heads in the substep B-1 in the variation of the embodiment of the present invention.
Figure 6B:
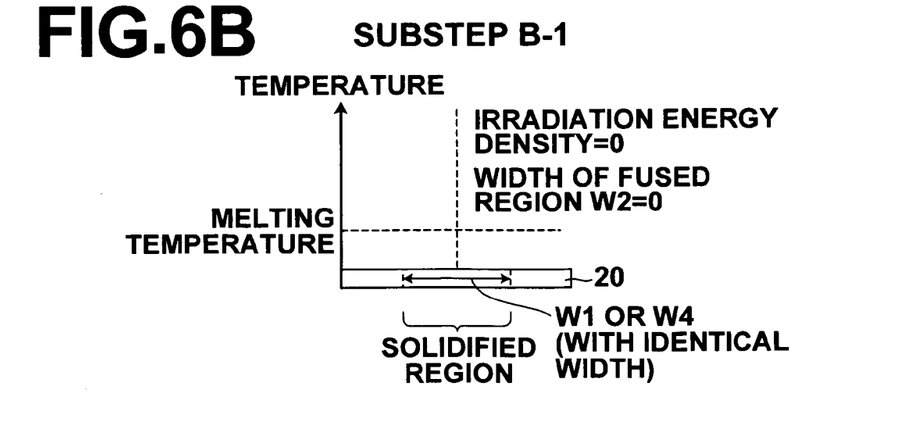
FIG. 6B is a graph indicating examples of the distributions of the irradiation energy density of the laser light and the film temperature over the fused region in the substep B-1 in the variation of the embodiment of the present invention.
Figure 7A:
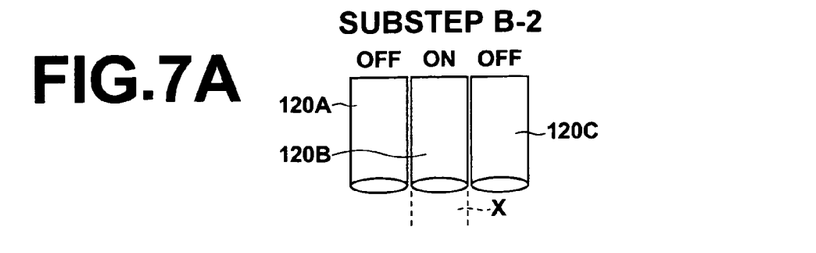
FIG. 7A is a diagram illustrating the arrangement of the plurality of laser heads and the operational states of the plurality of laser heads in the substep B-2 in the variation of the embodiment of the present invention.
Figure 7B:
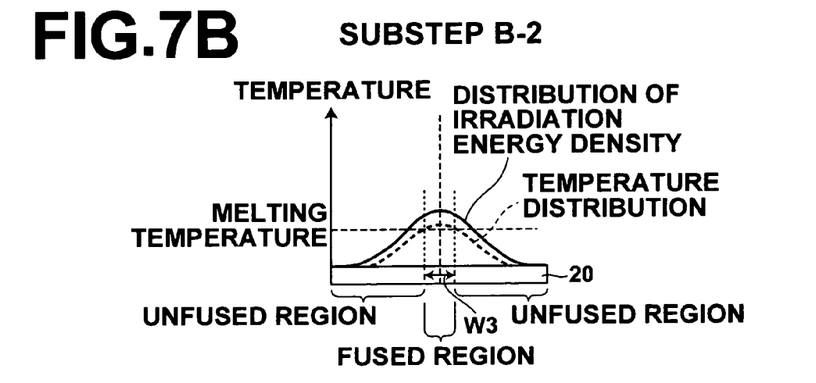
FIG. 7B is a graph indicating examples of the distributions of the irradiation energy density of the laser light and the film temperature over the fused region in the substep B-2 in the variation of the embodiment of the present invention.
Figure 8A:
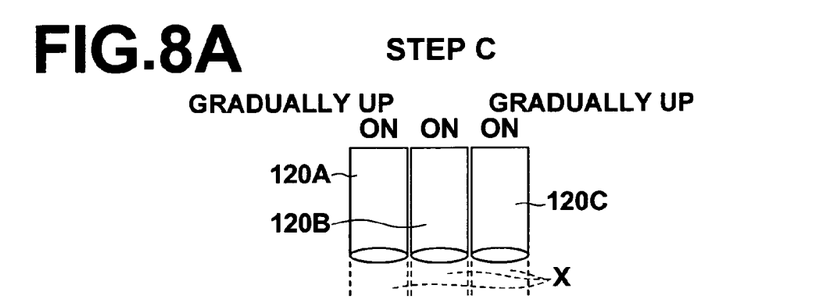
FIG. 8A is a diagram illustrating the arrangement of the plurality of laser heads and the operational states of the plurality of laser heads in the step C in the variation of the embodiment of the present invention.
Figure 8B:
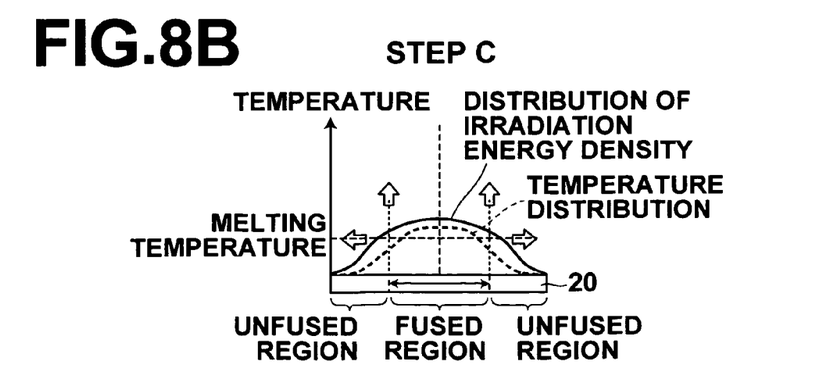
FIG. 8B is a graph indicating examples of the distributions of the irradiation energy density of the laser light and the film temperature over the fused region in the step C in the variation of the embodiment of the present invention.

FIG. 5A is a diagram illustrating an arrangement of a plurality of laser heads and the operational states of the plurality of laser heads in the step A or D in a variation of the embodiment of the present invention, and FIG. 5B is a graph indicating examples of the distributions of the irradiation energy density of the laser light and the film temperature over a fused region in the step A or D in the variation of the embodiment of the present invention. FIG. 6A is a diagram illustrating the arrangement of the plurality of laser heads and the operational states of the plurality of laser heads in the substep B-1 in the variation of the embodiment of the present invention, and FIG. 6B is a graph indicating examples of the distributions of the irradiation energy density of the laser light and the film temperature over the fused region in the substep B-1 in the variation of the embodiment of the present invention. FIG. 7A is a diagram illustrating the arrangement of the plurality of laser heads and the operational states of the plurality of laser heads in the substep B-2 in the variation of the embodiment of the present invention, and FIG. 7B is a graph indicating examples of the distributions of the irradiation energy density of the laser light and the film temperature over the fused region in the substep B-2 in the variation of the embodiment of the present invention. FIG. 8A is a diagram illustrating the arrangement of the plurality of laser heads and the operational states of the plurality of laser heads in the step C in the variation of the embodiment of the present invention, and FIG. 8B is a graph indicating examples of the distributions of the irradiation energy density of the laser light and the film temperature over the fused region in the step C in the variation of the embodiment of the present invention.

In the example illustrated in FIGS. 5A, 6A, 7A, and 8A, three laser heads 120A, 120B, and 120C are arrayed along a line in the y direction (perpendicular to the main scanning direction). For example, all the laser heads 120A, 120B, and 120C are turned on as illustrated in FIG. 5A in the steps A and D, all the laser heads 120A, 120B, and 120C are turned off as illustrated in FIG. 6A in the substep B-1 for the solidification, only the laser head 120B in the center of the array is turned on in the substep B-2 for the re-fusing, and only the output power of the laser heads 120A and 120C (located on both sides of the laser head 120B) is stepwise or continuously increased while maintaining the output power of the laser head 120B in the step C (in which the width of the fused region is stepwise or continuously increased). Thus, it is possible to control the solidification of the portion of the fused region and the change in the width of the fused region in a similar manner to the case where the laser annealing system 100 comprises only the single laser head 120, so that similar advantages to the advantages (1) to (5) explained before can be obtained.

Semiconductor Film, Semiconductor Device, and Active-Matrix Substrate

Hereinbelow, the structures of and a process for producing a semiconductor film, a semiconductor device, and an active-matrix substrate according to the embodiment of the present invention are explained with reference to FIGS. 9A to 9H, which are cross-sectional views of the structures in representative stages in the process for producing the semiconductor film, the semiconductor device, and the active-matrix substrate. In the examples explained below, the semiconductor device is an n-type top-gate thin-film transistor (TFT), and the active-matrix substrate comprises switching elements each realized by the above TFT.

Figure 9A:
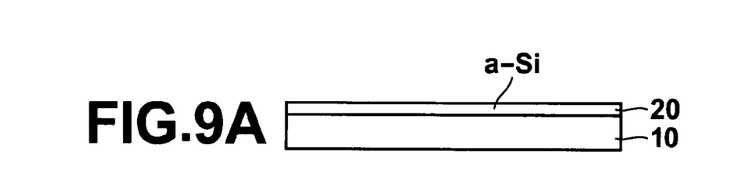
FIGS. 9A, 9B, 9C, 9D, 9E, 9F, 9G, and 9H are cross-sectional views of the structures in respective stages in a process for producing a semiconductor film, a semiconductor device, and an active-matrix substrate according to the embodiment of the present invention.

In the first step in the process illustrated in FIG. 9A, an a-Si film 20 is formed over the entire upper surface of a substrate 10 by CVD (chemical vapor deposition) or the like. There is no limitation on the composition or the shape of the substrate 10. For example, the substrate 10 is a quartz glass substrate, a non-alkali glass substrate, or a plastic substrate, and may have a rectangular shape (for example, with the dimensions of 550 mm×650 mm and the thickness of 0.7 mm), or be a wafer (for example, with the diameter of 100 mm and the thickness of 0.525 mm). The thickness of the a-Si film 20 is not specifically limited. An example of a preferable thickness of the a-Si film 20 is approximately 50 nm. Although the a-Si film 20 may be formed immediately on the substrate 10, alternatively, a thin film of silicon oxide, silicon nitride, or the like may be formed between the substrate 10 and the a-Si film 20.

Figure 9B:
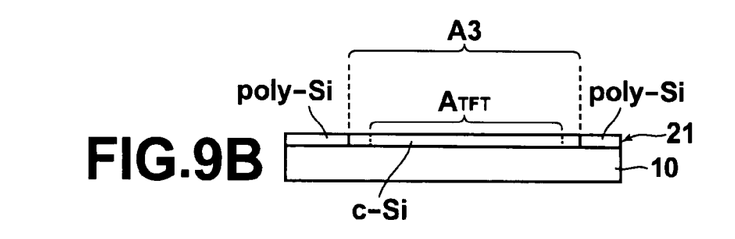

In the second step in the process illustrated in FIG. 9B, the laser annealing according to the embodiment as explained before is performed on the a-Si film 20 in order to increase the crystallinity of the a-Si film 20. At this time, the aforementioned third section A3 of the bandlike area is determined so as to cover the element-formation area $A_{TFT}$, on which a TFT is to be formed. Thus, it is possible to selectively increase the crystallinity of the third section A3 of the bandlike area, and make the third section A3 substantially monocrystalline. In FIG. 9B, the laser-annealed Si film is indicated by the reference 21. In the following explanations, it is assumed that the third section A3 containing the element-formation area $A_{TFT}$ is transformed into monocrystalline silicon (c-Si), and the other sections of the annealed bandlike area are transformed into polycrystalline silicon (poly-Si), by the above laser annealing. For simple illustration, the second section A2 of the bandlike area is not indicated in FIGS. 9A to 9H, and the explanation on the second section A2 is not repeated here.

Figure 9C:
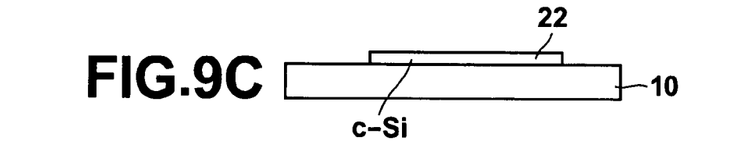

In the third step in the process illustrated in FIG. 9C, the portions of the third section A3 other than the element-formation area $A_{TFT}$ are removed by performing patterning and photolithography on the laser-annealed Si film 21, so that a c-Si film 22 remains on the substrate 10.

Figure 9D:
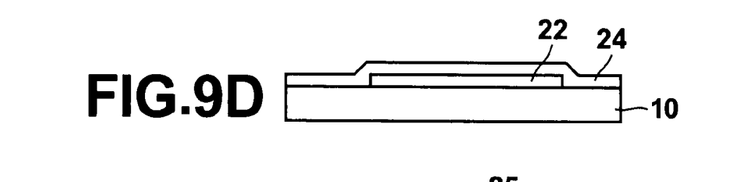

In the fourth step in the process illustrated in FIG. 9D, a gate insulation film 24 of $SiO_2$ is formed by CVD, sputtering, or the like over the structure formed in the third step. The thickness of the gate insulation film 24 is not specifically limited. An example of a preferable thickness of the gate insulation film 24 is approximately 100 nm.

Figure 9E:
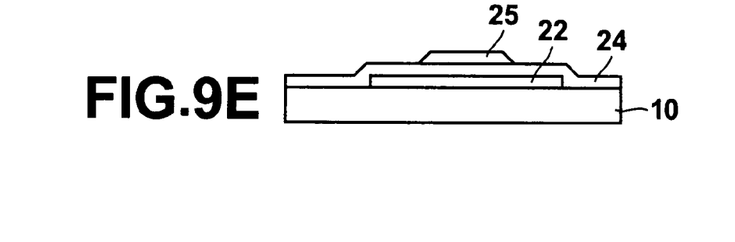

In the fifth step in the process illustrated in FIG. 9E, a gate electrode 25 is formed on the c-Si film 22 by covering the upper side of the structure formed in the fourth step, with a material and performing patterning.

Figure 9F:
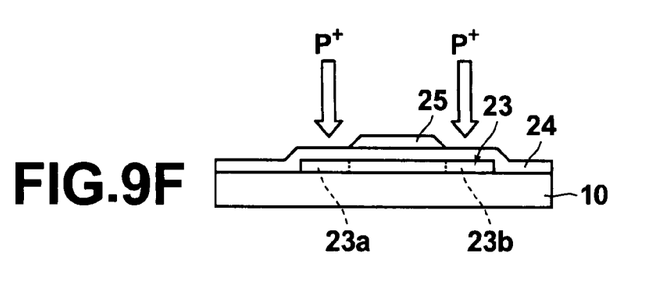

In the sixth step in the process illustrated in FIG. 9F, portions of the c-Si film 22 are doped with a dopant such as phosphorus (P), boron (B), or the like by using the gate electrode 25 as a mask, so that active regions are formed as a source region 23a and a drain region 23b. In FIG. 9F, it is assumed that the dopant is phosphorus. An example of a preferable dopant dosage is approximately $3.0\times10^{15}$ ions/$cm^2$. Thus, a silicon film 23 having the source region 23a and the drain region 23b is produced for use as an active layer of the TFT.

Figure 9G:
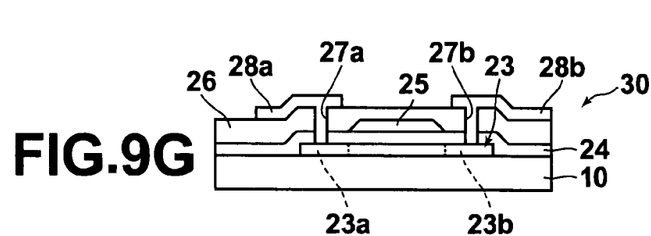

In the seventh step in the process illustrated in FIG. 9G, an interlayer insulation film 26 of $SiO_2$, SiN, or the like is formed over the upper side of the structure formed in the sixth step, and then contact holes 27a and 27b are formed through the interlayer insulation film 26 by etching (e.g., dry etching or wet etching) so that the contact holes 27a and 27b reach the source region 23a and the drain region 23b, respectively. Thereafter, a source electrode 28a and a drain electrode 28b are respectively formed on predetermined areas of the interlayer insulation film 26 over the contact holes 27a and 27b so that the contact holes 27a and 27b are respectively filled with the source electrode 28a and the drain electrode 28b, and the source electrode 28a and the drain electrode 28b respectively come into contact with the source region 23a and the drain region 23b.

Thus, the production of the TFT 30 according to the present embodiment is completed. In addition, the laser-annealed Si film 21 (illustrated in FIG. 9B) before the patterning, the c-Si film 22 (illustrated in FIG. 9B) after the patterning and before the doping, and the silicon film 23 (illustrated in FIG. 9F) after the doping each correspond to the semiconductor film (which is laser annealed by the laser annealing process) according to the present invention.

Figure 9H:
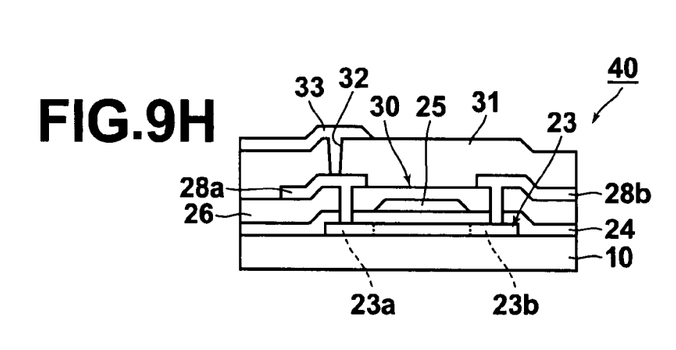

Next, in the eighth step in the process illustrated in FIG. 9H, an interlayer insulation film 31 of $SiO_2$, SiN, or the like is formed over the upper side of the structure formed in the seventh step, and then a contact hole 32 is formed through the interlayer insulation film 31 by etching (e.g., dry etching or wet etching) so that contact hole 32 reaches the source electrode 28a. Thereafter, a pixel electrode 33 is formed on a predetermined area of the interlayer insulation film 31 over the contact hole 32 so that the contact hole 32 is filled with the pixel electrode 33, and the pixel electrode 33 comes into contact with the source electrode 28a.

Although the structures in the respective steps in a process for producing a portion containing a TFT and corresponding to only one pixel are illustrated in FIGS. 9A to 9H, in practice, a number of TFTs are formed on the substrate 10 so that the TFTs are arrayed in a matrix, and a number of pixel electrodes are respectively formed over the corresponding TFTs. Thus, the production of the active-matrix substrate 40 according to the present embodiment is completed in the eighth step. Although not shown, in practice, wirings for scanning lines and signal lines are formed during the production of the active-matrix substrate 40. The scanning lines may be formed together with or separately from the gate electrodes 25, and the signal lines may be formed together with or separately from the drain electrodes 28b.

The laser-annealed Si film 21, the c-Si film 22, and the silicon film 23 produced during the above process are laser annealed by using the laser annealing process according to the present invention. Therefore, the laser-annealed Si film 21, the c-Si film 22, and the silicon film 23 have high crystallinity, and are silicon films suitable for use as (or in production of) the active layer of a TFT. In addition, since the TFT 30 according to the present embodiment is produced by using the laser-annealed Si film 21, the c-Si film 22, and the silicon film 23, the TFT 30 is superior in the element characteristics (such as the carrier mobility) and the element uniformity. Therefore, the active-matrix substrate 40 having the TFTs 30 as above exhibits high performance when the active-matrix substrate 40 is used in an electro-optic device.

Electro-Optic Device

Figure 10:
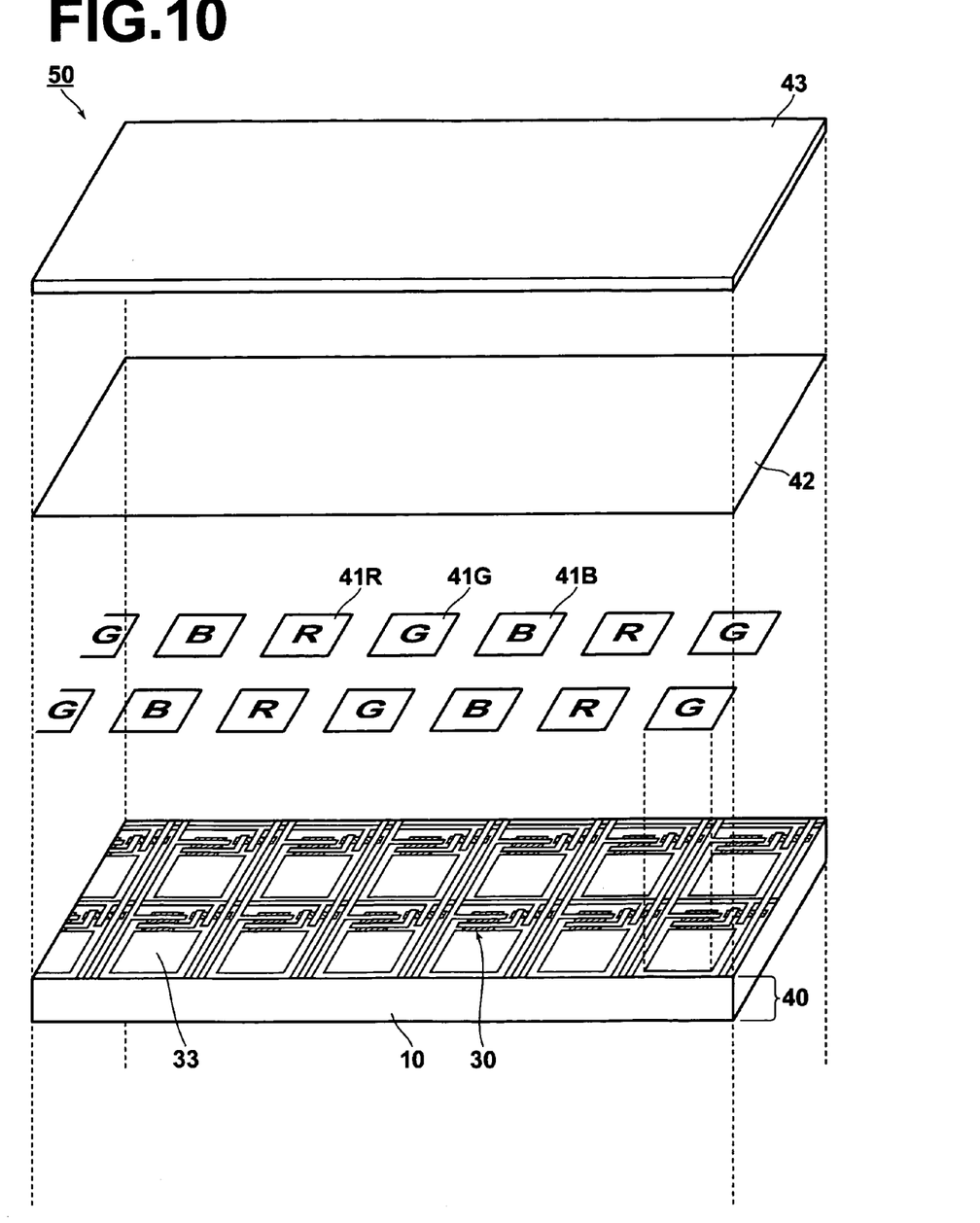
FIG. 10 is an exploded perspective view of an organic electroluminescence (EL) device as the electro-optic device according to the embodiment of the present invention.

Hereinbelow, the structure of an electro-optic device according to the embodiment of the present invention is explained. The present invention can be applied to an organic electroluminescence (EL) device or a liquid crystal device. In the following explanations, present invention is applied to an organic EL device as an example. FIG. 10 is an exploded perspective view of an organic EL device as the electro-optic device according to the embodiment.

As illustrated in FIG. 10, the organic EL device 50 according to the present embodiment is produced by forming on the active-matrix substrate 40 light emission layers 41R, 41G, and 41B in predetermined patterns, and thereafter forming a common electrode 42 and a sealing film 43 in this order over the light emission layers 41R, 41G, and 41B. The light emission layers 41R, 41G, and 41B respectively emit red light (R), green light (G), and blue light (B) when electric current is applied to the light emission layers 41R, 41G, and 41B. Alternatively, sealing of the organic EL device 50 may be realized by using a sealing member such as a metal can or a glass substrate, instead of the sealing film 43. The light emission layers 41R, 41G, and 41B are formed in patterns corresponding to the pixel electrodes 33 so that each pixel is constituted by three dots respectively emitting red light, green light, and blue light. The common electrode 42 and the sealing film 43 are formed over the entire upper surface of the active-matrix substrate 40. Alternatively, the organic EL device 50 may be sealed by using another type of sealing member such as a metal can or a glass substrate, instead of the sealing film 43. In this case, a drying agent such as calcium oxide may be contained in the sealed structure of the organic EL device 50.

In the organic EL device 50, the polarity of the pixel electrodes 33 is opposite to the polarity of the common electrode 42. That is, the pixel electrodes 33 are cathodes when the common electrode 42 is an anode, and the pixel electrodes 33 are anodes when the common electrode 42 is a cathode. The light emission layers 41R, 41G, and 41B emit light when positive holes injected from an anode and electrons injected from a cathode recombine and recombination energy is released.

Further, in order to increase the emission efficiency, it is possible to arrange a positive-hole injection layer and/or a positive-hole transportation layer between the anode(s) and the light emission layers 41R, 41G, and 41B, and/or arrange an electron injection layer and/or an electron transportation layer between the cathode(s) and the light emission layers 41R, 41G, and 41B.

Since the organic EL device 50 according to the present embodiment is constructed by using the active-matrix substrate 40 as explained before, the TFTs 30 constituting the organic EL device 50 are superior in the element uniformity. Therefore, the organic EL device 50 is greatly superior in the uniformity in the electro-optic characteristics such as the display quality. In addition, since the TFTs 30 are superior in the element characteristics, the organic EL device 50 according to the present embodiment is superior to the conventional organic EL device in the reduction in power consumption, the reduction in the area in which peripheral circuits are formed, and the freedom of choice of the type of the peripheral circuits.

Other Matters

The laser annealing system and the laser annealing process according to the present invention can be preferably used in production of TFTs and electro-optic devices having TFTs, and the like.

What is claimed is:

1. A laser annealing process for performing laser annealing of a nonmonocrystalline semiconductor film by scanning and irradiating the nonmonocrystalline semiconductor film with continuous-wave laser light so as to increase crystallinity of a laser-annealed area of the nonmonocrystalline semiconductor film in such a manner that crystallinity of a part of the laser-annealed area is higher than crystallinity of other parts of the laser-annealed area, comprising the steps of:

(a) scanning and irradiating, with said continuous-wave laser light, a first section of a bandlike area of said nonmonocrystalline semiconductor film so as to produce a first fused region having a substantially uniform width in the first section of the bandlike area, where the bandlike area contains a predetermined portion which is required to have higher crystallinity than other portions of the bandlike area, and the first section is apart from the predetermined portion;

(b) solidifying at least a portion of said first fused region which is last fused in said step (a);

(c) re-fusing at least a subportion of said at least a portion of the first fused region solidified in the step (b) in such a manner that said at least a subportion of said at least a portion of the first fused region has a width smaller than said substantially uniform width of said first fused region;

(d) uninterruptedly after the operation in said step (c), scanning and irradiating, with said continuous-wave laser light, a second section of said bandlike area so as to produce a second fused region in the second section of the bandlike area in such a manner that the second fused region has a width which stepwise or continuously increases from said width of said at least a subportion of said at least a portion of the first fused region at a boundary between said first section and the second section, where the second section is located between the first section and said predetermined portion, and abuts the first section; and (e) uninterruptedly after the operation in said step (d), scanning and irradiating, with said continuous-wave laser light, a third section of said bandlike area so as to produce a third fused region in the third section of the bandlike area in such a manner that the third fused region has a width which is substantially identical to said width of the second fused region at a boundary between said second section and the third section, where the third section abuts the second section, and contains said predetermined portion.

2. A laser annealing process according to claim 1, wherein said width of the second fused region is continuously increased from said width of said at least a subportion of said at least a portion of the first fused region at the boundary between the first section and the second section.

3. A laser annealing process according to claim 1, wherein said width of the second fused region is stepwise or continuously increased by stepwise or continuously increasing the output power of the continuous-wave laser light in said step (d).

4. A laser annealing process according to claim 1, wherein said continuous-wave laser light is realized by a plurality of laser beams outputted from a plurality of laser-light sources, said width of the second fused region is stepwise or continuously increased by stepwise or continuously increasing the output power of at least one of the plurality of laser beams in said step (d).

5. A laser annealing process according to claim 1, wherein said continuous-wave laser light is emitted from one or more semiconductor lasers.

6. A laser annealing process according to claim 1, wherein said step (b) is performed in such a manner that a condition t<L/2V is satisfied at each moment in the scanning of the second section, L is a dimension, in a scanning direction, of an area of the nonmonocrystalline semiconductor film irradiated with the continuous-wave laser light at said each moment, V is a relative velocity between the continuous-wave laser light and the nonmonocrystalline semiconductor film, and t is a time for which the step (b) is performed.

7. A laser annealing process according to claim 1, wherein said step (b) is performed for a duration greater than 100 nanoseconds.

8. A laser annealing system for performing laser annealing of a nonmonocrystalline semiconductor film by scanning and irradiating the nonmonocrystalline semiconductor film with continuous-wave laser light so as to increase crystallinity of a laser-annealed area of the nonmonocrystalline semiconductor film in such a manner that crystallinity of a part of the laser-annealed area is higher than crystallinity of other parts of the laser-annealed area, comprising:

a laser-light irradiation unit which irradiates an area of the nonmonocrystalline semiconductor film with the continuous-wave laser light at each moment;

a scanning unit which moves at least one of said continuous-wave laser light and said nonmonocrystalline semiconductor film so as to scan the nonmonocrystalline semiconductor film with the continuous-wave laser light; and a control unit which controls said laser-light irradiation unit and said scanning unit so that the laser annealing system performs the steps of, (a) scanning and irradiating, with said continuous-wave laser light, a first section of a bandlike area of said nonmonocrystalline semiconductor film so as to produce a first fused region having a substantially uniform width in the first section of the bandlike area, where the bandlike area contains a predetermined portion which is required to have higher crystallinity than other portions of the bandlike area, and the first section is apart from the predetermined portion, (b) solidifying at least a portion of said first fused region which is last fused in said step (a), (c) re-fusing at least a subportion of said at least a portion of the first fused region solidified in the step (b) in such a manner that said at least a subportion of said at least a portion of the first fused region has a width smaller than said substantially uniform width of said first fused region, (d) uninterruptedly after the operation in said step (c), scanning and irradiating, with said continuous-wave laser light, a second section of said bandlike area so as to produce a second fused region in the second section of the bandlike area in such a manner that the second fused region has a width which stepwise or continuously increases from said width of said at least a subportion of said at least a portion of the first fused region at a boundary between said first section and the second section, where the second section is located between the first section and said predetermined portion, and abuts the first section, and (e) uninterruptedly after the operation in said step (d), scanning and irradiating, with said continuous-wave laser light, a third section of said bandlike area so as to produce a third fused region in the third section of the bandlike area in such a manner that the third fused region has a width which is substantially identical to said width of the second fused region at a boundary between said second section and the third section, where the third section abuts the second section, and contains said predetermined portion.

9. A laser annealing system according to claim 8, wherein said width of the second fused region is continuously increased from said width of said at least a subportion of said at least a portion of the first fused region at the boundary between the first section and the second section.

10. A laser annealing system according to claim 8, wherein said width of the second fused region is stepwise or continuously increased by stepwise or continuously increasing the output power of the continuous-wave laser light in said step (d).

11. A laser annealing system according to claim 8, wherein said continuous-wave laser light is realized by a plurality of laser beams outputted from a plurality of laser-light sources, said width of the second fused region is stepwise or continuously increased by stepwise or continuously increasing the output power of at least one of the plurality of laser beams in said step (d).

12. A laser annealing system according to claim 8, wherein said continuous-wave laser light is emitted from one or more semiconductor lasers.

13. A laser annealing system according to claim 8, wherein said step (b) is performed in such a manner that a condition t<L/2V is satisfied at each moment in the scanning of the second section, L is a dimension, in a scanning direction, of an area of the nonmonocrystalline semiconductor film irradiated with the continuous-wave laser light at said each moment, V is a relative velocity between the continuous-wave laser light and the nonmonocrystalline semiconductor film, and t is a time for which the step (b) is performed.

14. A laser annealing system according to claim 8, wherein said step (b) is performed for a duration greater than 100 nanoseconds.

15. A semiconductor film produced by using the laser annealing process according to claim 1.

16. A semiconductor device comprising as an active layer the semiconductor film according to claim 15 in which an active region is formed in said predetermined portion of the bandlike area.

17. An electro-optic device comprising the semiconductor device according to claim 16.

* * * * *